(12) United States Patent  
Matsui et al.

(10) Patent No.: US 12,363,827 B2
(45) Date of Patent: *Jul. 15, 2025

(54) PRINTED WIRING BOARD AND METHOD FOR MANUFACTURING PRINTED WIRING BOARD

(71) Applicant: IBIDEN CO., LTD., Gifu (JP)

(72) Inventors: Yoshiki Matsui, Ogaki (JP); Atsushi Deguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/616,256

(22) Filed: Mar. 26, 2024

(65) Prior Publication Data

US 2024/0268023 A1 Aug. 8, 2024

Related U.S. Application Data

(63) Continuation of application No. 17/702,310, filed on Mar. 23, 2022, now Pat. No. 11,963,298.

(30) Foreign Application Priority Data

Apr. 8, 2021 (JP) ................... 2021-065746

(51) Int. Cl.
*H05K 1/11* (2006.01)
*H05K 1/09* (2006.01)
(Continued)

(52) U.S. Cl.
CPC ................. *H05K 1/11* (2013.01); *H05K 1/09* (2013.01); *H05K 3/4007* (2013.01); *H05K 1/111* (2013.01);
(Continued)

(58) Field of Classification Search
CPC .......... H05K 1/11; H05K 1/09; H05K 3/4007; H05K 1/18; H05K 2201/2081; H05K 1/111; H05K 3/181; Y02P 70/50
See application file for complete search history.

(56) References Cited

U.S. PATENT DOCUMENTS 10,856,415 B2 * 12/2020 Terauchi .................. H05K 3/34
11,963,298 B2 * 4/2024 Matsui .................. H05K 3/181
(Continued)

FOREIGN PATENT DOCUMENTS

JP 2010-129996 A 6/2010

*Primary Examiner* — Ishwarbhai B Patel
(74) *Attorney, Agent, or Firm* — Finnegan, Henderson, Farabow, Garrett & Dunner, LLP

(57) ABSTRACT

A printed wiring board includes a base insulating layer, a conductor layer formed on the base layer and including first and second pads, a solder resist layer formed on the base layer, covering the conductor layer and having first opening exposing the first pad and second opening exposing the second pad, bumps including a first bump and a second bump such that the first bump is formed on the first conductor pad of the conductor layer and that the second bump is formed on the second conductor pad of the conductor layer. The second opening has diameter smaller than diameter of the first opening, the second bump has diameter smaller than diameter of the first bump, the first pad has a first recess formed on the first pad, the second pad has a second recess formed on the second pad, and the first recess is larger than the second recess.

20 Claims, 5 Drawing Sheets

(51) Int. Cl.
 *H05K 1/18* (2006.01)
 *H05K 3/40* (2006.01)
(52) U.S. Cl.
 CPC ....... *H05K 1/18* (2013.01); *H05K 2201/2081* (2013.01)

(56) References Cited

U.S. PATENT DOCUMENTS

| | | | |
|---|---|---|---|
| 2003/0178229 A1* | 9/2003 | Toyoda | H05K 3/4688 174/261 |
| 2013/0284499 A1 | 10/2013 | Imafuji | |
| 2017/0179012 A1 | 6/2017 | Shimodaira | |
| 2017/0250153 A1 | 8/2017 | Kikuchi et al. | |
| 2019/0304942 A1 | 10/2019 | Takeuchi et al. | |
| 2021/0037660 A1* | 2/2021 | Kawai | H05K 1/111 |
| 2021/0068265 A1* | 3/2021 | Sawada | H05K 1/113 |
| 2021/0092841 A1 | 3/2021 | Yoshida et al. | |

* cited by examiner

Prior Art

PRINTED WIRING BOARD AND METHOD FOR MANUFACTURING PRINTED WIRING BOARD

CROSS-REFERENCE TO RELATED APPLICATIONS

The present application is a continuation of U.S. patent application Ser. No. 17/702,310, filed Mar. 23, 2022, now U.S. Pat. No. 11,963,298, issued Apr. 16, 2024, which is based upon and claims the benefit of priority to Japanese Patent Application No. 2021-065746, filed Apr. 8, 2021. The present application claims the benefit of priority to U.S. patent application Ser. No. 17/702,310 and Japanese Patent Application No. 2021-065746. The entire contents of these applications are incorporated herein by reference.

BACKGROUND OF THE INVENTION

Field of the Invention

The present invention relates to a printed wiring board having plating bumps, and a method for manufacturing the printed wiring board.

Description of Background Art

Japanese Patent Application Laid-Open Publication No. 2010-129996 describes bump formation using a plating method. The entire contents of this publication are incorporated herein by reference.

SUMMARY OF THE INVENTION

According to one aspect of the present invention, a printed wiring board includes a base insulating layer, a conductor layer formed on the base insulating layer and including a first conductor pad and a second conductor pad, a solder resist layer formed on the base insulating layer such that the solder resist layer is covering the conductor layer and has a first opening exposing the first conductor pad and a second opening exposing the second conductor pad, a first bump formed on the first conductor pad of the conductor layer and including a first base plating layer formed in the first opening of the solder resist layer and a first top plating layer formed on the first base plating layer, and a second bump formed on the second conductor pad of the conductor layer and including a second base plating layer formed in the second opening of the solder resist layer and a second top plating layer formed on the second base plating layer. The solder resist layer is formed such that the second opening has a diameter smaller than a diameter of the first opening, the second bump is formed such that the second bump has a diameter smaller than a diameter of the first bump, and the conductor layer is formed such that the first conductor pad has a first recess formed on a surface of the first conductor pad, that the second conductor pad has a second recess formed on a surface of the second conductor pad, and that the first recess is larger than the second recess.

According to another aspect of the present invention, a method for manufacturing a printed wiring board includes forming, on a base insulating layer, a conductor layer including a first conductor pad and a second conductor pad, forming a solder resist layer on the base insulating layer such that the solder resist layer covers the conductor layer, forming a first opening in the solder resist layer such that the first opening exposes the first conductor pad of the conductor layer, forming a second opening in the solder resist layer such that the second opening exposes the second conductor pad of the conductor layer, forming a first recess on a surface of the first conductor pad exposed by the first opening of the solder resist layer, forming a second recess on a surface of the second conductor pad exposed by the second opening of the solder resist layer such that the first recess is larger than the second recess, forming, on the first conductor pad, a first bump including a first base plating layer in the first opening of the solder resist layer and a first top plating layer on the first base plating layer, and forming, on the second conductor pad, a second bump including a second base plating layer in the second opening of the solder resist layer and a second top plating layer on the second base plating layer. The forming of the second opening includes forming the second opening in the solder resist layer such that the second opening has a diameter smaller than a diameter of the first opening, the forming of the first bump includes forming the first base plating layer in the first opening, forming the first top plating layer on the first base plating layer, and reflowing the first top plating layer, and the forming of the second bump includes forming the second base plating layer in the second opening, forming the second top plating layer on the second base plating layer, reflowing the second top plating layer, and forming the second bump on the second conductor pad such that the second bump has a diameter smaller than a diameter of the first bump.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
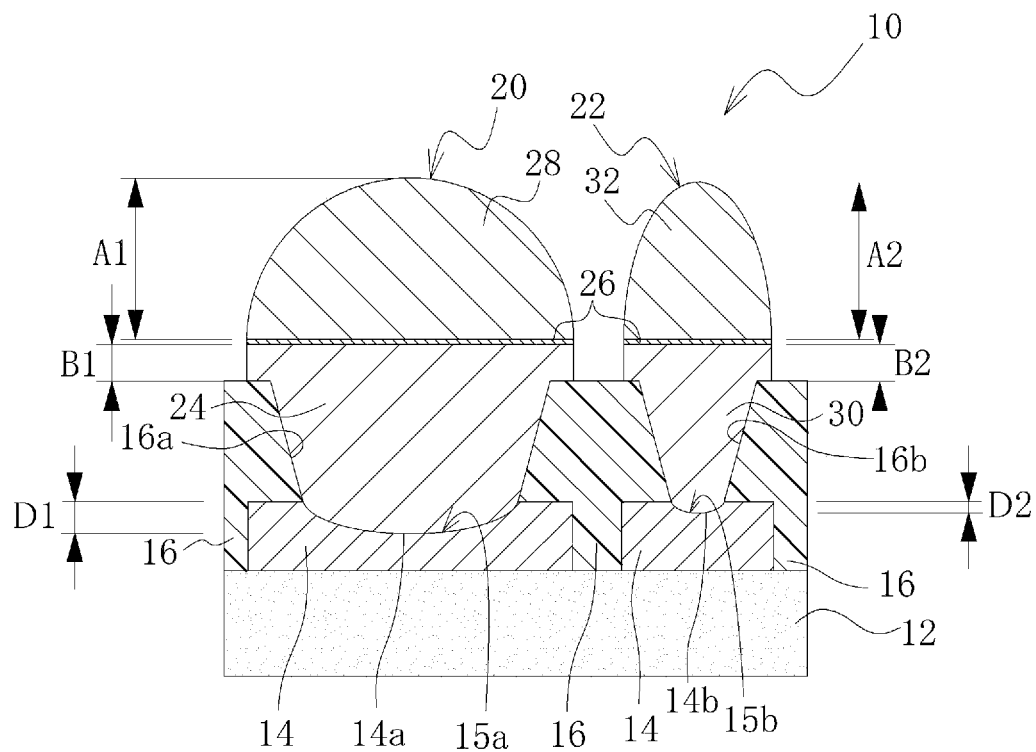
FIG. 1 is a cross-sectional view illustrating a printed wiring board according to an embodiment of the present invention.

Embodiments will now be described with reference to the accompanying drawings, wherein like reference numerals designate corresponding or identical elements throughout the various drawings.

Printed Wiring Board

Figure 2:
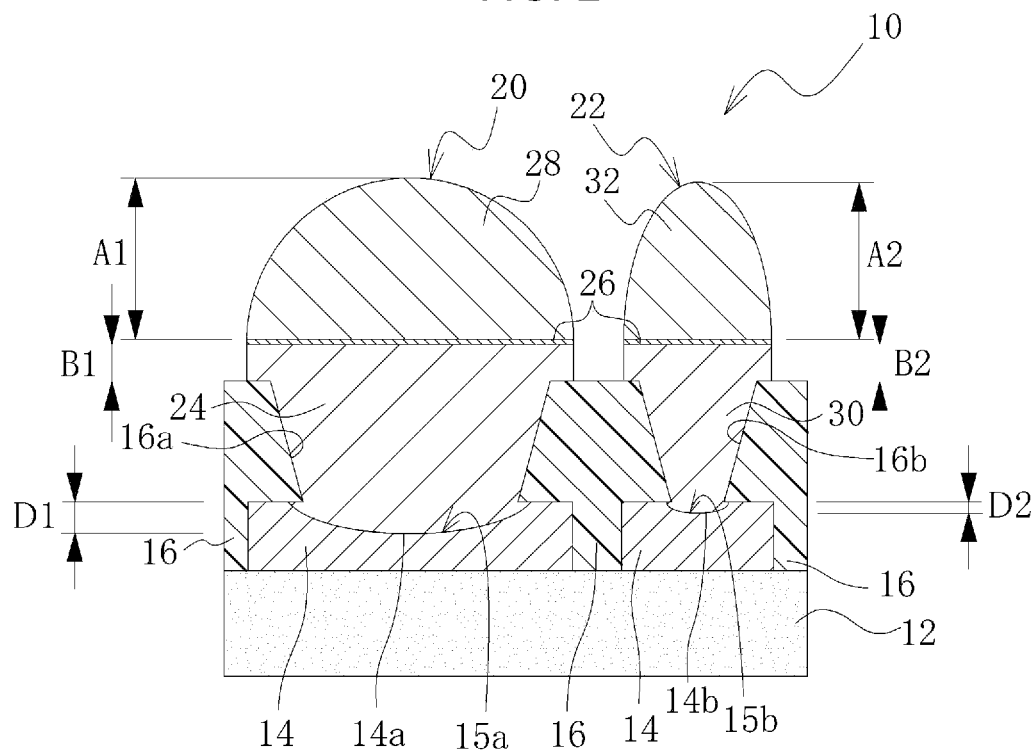
FIG. 2 is a cross-sectional view illustrating a printed wiring board according to another embodiment of the present invention.

A printed wiring board according to an embodiment of the present invention is described below with reference to the drawings. FIGS. 1 and 2 each illustrate an enlarged view of a portion of a printed wiring board 10 of the embodiment. In the examples illustrated in FIGS. 1 and 2, dimensions of members, especially dimensions in a height direction, are described with dimensions different from actual dimensions so as to facilitate better understanding of the characteristics of the present invention.

FIG. 1 is a cross-sectional view illustrating a printed wiring board according to an embodiment of the present invention. In the example illustrated in FIG. 1, the printed wiring board 10 may be a substrate with a core formed by alternately laminating conductor layers and insulating layers on one side or both sides of a core substrate (not illustrated in the drawings), the conductor layers having predetermined circuit patterns. When the conductor layers are formed on both sides of the core substrate, conductor layers opposing each other via the core substrate may be connected to each other via through-hole conductors (not illustrated in the drawings). Or, the printed wiring board 10 may be a coreless substrate obtained by alternately laminating conductor layers and insulating layers on a support plate (not illustrated in the drawings) instead of a core substrate and then removing the support plate. In any case, as illustrated in FIG. 1, the printed wiring board 10 includes at least a base insulating layer 12, which is formed outermost among the resin insulating layers, a conductor layer 14, which is formed on the base insulating layer 12 and has a predetermined circuit pattern, and a solder resist layer 16, which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one base insulating layer 12 and one conductor layer 14.

The base insulating layer 12 can be formed of, for example, a resin composition or the like containing an inorganic filler, such as silica or alumina, and an epoxy resin. The conductor layer 14 is formed of a conductive metal, for example, a metal containing copper as a main component.

The solder resist layer 16 has a first opening (16a) exposing a portion of the conductor layer 14 as a first conductor pad (14a) and a second opening (16b) having a smaller diameter than the first opening (16a) and exposing another portion of the conductor layer 14 as a second conductor pad (14b). An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

In the printed wiring board 10 according to the embodiment of the present invention, an upper surface of the first conductor pad (14a) has a first recess (15a) having a depth (D1). Further, an upper surface of the second conductor pad (14b) has a second recess (15b) having a depth (D2). The first recess (15a) is larger than the second recess (15b). Specifically, a difference (D1-D2) between the depth (D1) of the first recess (15a) and the depth (D2) of the second recess (15b) is preferably 1.5 μm or more.

An underlayer (not illustrated in the drawings) may be formed on each of the first and second conductor pads (14a, 14b). As the underlayer, a nickel layer formed on the surface of each of the first and second conductor pads (14a, 14b), a palladium layer formed on the nickel layer, and a gold layer formed on the palladium layer can be exemplified. In addition, a nickel layer and a gold layer formed on the nickel layer can be exemplified.

The printed wiring board 10 further includes a first bump 20, which is formed on the first conductor pad (14a), and a second bump 22, which is formed on the second conductor pad (14b) and has a smaller diameter than the first bump 20. The first and second bumps (20, 22) can be respectively formed directly on the first and second conductor pads (14a, 14b). The first bump 20 can be used for connecting to a power source or a ground line. The second bump 22 having a smaller diameter than the first bump 20 can be used for connecting to a signal line.

The first bump 20 has a first base plating layer 24 formed in the first opening (16a), and a first top plating layer 28 formed on the first base plating layer 24 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the first top plating layer 28 can be formed directly on the first base plating layer 24.

The first base plating layer 24 is formed of a conductive metal, preferably a metal containing copper as a main component. The first base plating layer 24 is preferably formed to a height exceeding a surface of the solder resist layer 16 (a surface on the opposite side with respect to the base insulating layer 12). As a result, the first bump 20 is stably held in the first opening (16a). A thickness (B1) of the first base plating layer 24 measured from the surface of the solder resist layer 16 is preferably within a range of 3 μm-20 μm.

The first top plating layer 28 is formed of a metal which has a lower melting point than the first base plating layer 24 and which is melted by a reflow treatment and is shaped into a substantially hemispherical shape as illustrated in FIG. 1, for example, a metal containing tin as a main component. A thickness (A1) of the first top plating layer 28 (a distance in a vertical direction from a lower end of the first top plating layer 28 to a top of the first top plating layer on an outer peripheral surface of the first bump 20) is preferably set in a range of 5 μm-45 μm. By setting the thickness (A1) of the first top plating layer 28 in this range, good connection reliability can be achieved between the first bump 20 and a connection pad (not illustrated in the drawings) of an electronic component such as a semiconductor chip or a memory mounted on the printed wiring board 10.

The second bump 22 has a second base plating layer 30 formed in the second opening (16b), and a second top plating layer 32 formed on the second base plating layer 30 via an intermediate layer 26 containing, for example, nickel as a main component. The intermediate layer 26 preferably has a thickness of 7 μm or less. It is also possible that the intermediate layer 26 is not formed. In the case where the intermediate layer 26 is not formed, the second top plating layer 32 can be formed directly on the second base plating layer 30.

The second base plating layer 30 is formed of a conductive metal, preferably a metal containing copper as a main component. The second base plating layer 30 is preferably formed to a height exceeding the surface of the solder resist layer 16 (the surface on the opposite side with respect to the base insulating layer 12). As a result, the second bump 22 is stably held in the second opening (16b). A thickness (B2) of the second base plating layer 30 measured from the surface of the solder resist layer 16 is preferably within a range of 3 μm-20 μm.

The second top plating layer 32 is formed of a metal which has a melting point lower than that of the second base plating layer 30 and which is melted by a reflow treatment and is shaped into a substantially hemispherical shape as illustrated in FIG. 1, for example, a metal containing tin as a main component. A thickness (A2) of the second top plating layer 32 (a distance in the vertical direction from a lower end of the second top plating layer 32 to a top of the second top plating layer 32 on an outer peripheral surface of the second bump 22) is preferably set in a range of 5 μm-45 μm. By setting the thickness (A2) of the second top plating layer 32 in this range, good connection reliability can be achieved between the second bump 22 and a connection pad (not illustrated in the drawings) of an electronic component such as a semiconductor chip or a memory mounted on the printed wiring board 10.

In the present embodiment, the thickness (A1) of the first top plating layer 28 may be larger than the thickness (A2) of the second top plating layer 32. Further, the thickness (B1) of the first base plating layer 24 relative to the surface of the solder resist layer 16 may be smaller than the thickness (B2) of the second base plating layer 30 relative to the surface of the solder resist layer 16.

In the printed wiring board according to the embodiment of the present invention, the first recess (15a) having the depth (D1) is formed on the upper surface of the first conductor pad (14a), and the second recess (15b) having the depth (D2) is formed on the upper surface of the second conductor pad (14b). Therefore, a length of an interface between the first conductor pad (14a) and the first base plating layer 24 on the first conductor pad (14a) can be increased as compared to a case where the first recess (15a) is not formed (a case of a flat surface). Similarly, a length of an interface between the second conductor pad (14b) and the second base plating layer 30 on the second conductor pad (14b) can be increased as compared to a case where the second recess (15b) is not formed (a case of a flat surface). As a result, connection reliability between the first conductor pad (14b) and the first base plating layer 24 and connection reliability between the second conductor pad (14b) and the second base plating layer 30 can both be improved.

The difference (D1-D2) between the depth (D1) of the first recess (15a) and the depth (D2) of the second recess (15b) is preferably 1.5 μm or more. The first opening (16a) is larger than the second opening (16b), and the first base plating layer 24 connecting to the first conductor pad (14a) is larger than the second base plating layer 30 connecting to the second conductor pad (14b) and thus requires a larger interface length, and therefore, the difference (D1-D2) between the two is at least 1.5 μm.

FIG. 2 is a cross-sectional view illustrating a printed wiring board according to another embodiment of the present invention. In the example illustrated in FIG. 2, members that are the same as in the example illustrated in FIG. 1 are indicated using the same reference numeral symbols and description thereof is omitted. The example illustrated in FIG. 2 is different from the example illustrated in FIG. 1 in that, in the first bump 20, the first recess (15a) is formed so as to extend on the upper surface of the first conductor pad (14a) exposed from the solder resist layer 16 to a portion of the conductor layer 14 surrounding the first conductor pad (14a) covered by the solder resist layer 16. According to the present embodiment, in addition to the effect that the interface length can be increased in the example illustrated in FIG. 1, by allowing the interface between the first conductor pad (14a) and the first base plating layer 24 on the first conductor pad (14a) to enter under the solder resist layer 16, connection reliability between the two can be further improved. The same structure and effect of the first bump 20 also apply to the second bump 22.

Method for Manufacturing Printed Wiring Board

In the following, a method for manufacturing the printed wiring board 10 illustrated in FIG. 1 according to an embodiment of the present invention is described with reference to FIGS. 3A-3I.

Figure 3A:
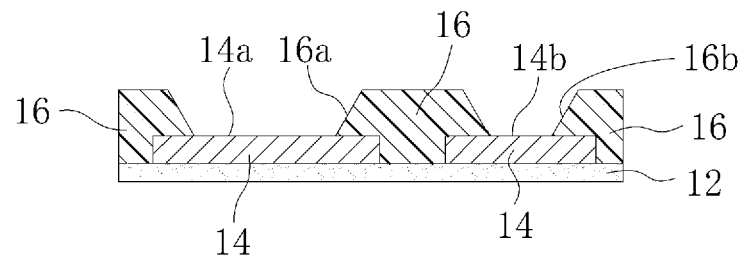
FIG. 3A is a cross-sectional view illustrating a method for manufacturing a printed wiring board according to an embodiment of the present invention.

FIG. 3A illustrates an intermediate in which the conductor layer 14 and the solder resist layer 16 may be formed on the base insulating layer 12 using a commonly known method, the conductor layer 14 having a predetermined circuit pattern. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12.

For the base insulating layer 12, an insulating resin film for a build-up layer containing an inorganic filler such as silica or alumina and an epoxy resin can be used. In the solder resist layer 16, for example, by using carbon dioxide gas laser or UV-YAG laser or the like, or by performing development after exposure, the first opening (16a) exposing a portion of the conductor layer 14 as the first conductor pad (14a) and the second opening (16b) exposing another portion of the conductor layer 14 as the second conductor pad (14b) are formed. The first opening (16a) preferably has an aspect ratio or 0.5 or less and the second opening (16b) preferably has an aspect ratio of 0.6 or more. On each of the first and second conductor pads (14a, 14b), an underlayer (not illustrated in the drawings) may be formed, for example, by laminating in this order a nickel layer, a palladium layer, and a gold layer by plating.

Figure 3B:
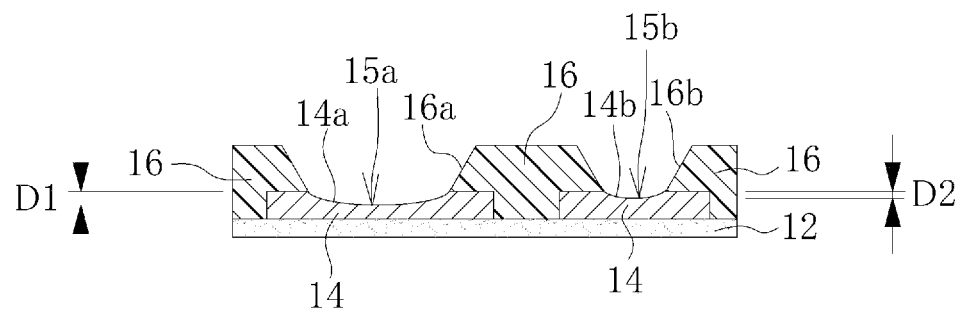
FIG. 3B is a cross-sectional view illustrating a method for manufacturing a printed wiring board according to an embodiment of the present invention.

In the method for manufacturing the printed wiring board according to the embodiment of the present invention, after the first opening (16a) and the second opening (16b) are formed in the solder resist layer 16, soft etching is performed with respect to side surfaces of the first opening (16a) and the second opening (16b), and the upper surface of the first conductor pad (14a) exposed in the first opening (16a) and the upper surface of the second conductor pad (14b) exposed in the second opening (16b) to remove resin residues remaining on these surfaces. As a result, as illustrated in FIG. 3B, the first recess (15a) having the depth (D1) and the second recess (15b) having the depth (D2) can be respectively formed on the upper surface of the first conductor pad (14a) and on the upper surface of the second conductor pad (14b) such that the first recess (15a) is larger than the second recess (15b).

Figure 3C:
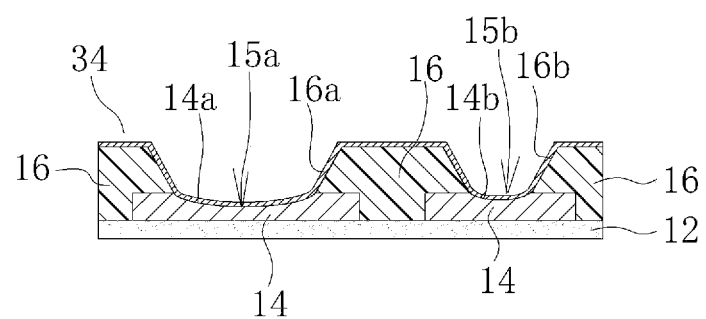
FIG. 3C is a cross-sectional view illustrating a method for manufacturing a printed wiring board according to an embodiment of the present invention.

Next, as illustrated in FIG. 3C, for example, an electroless plating treatment such as an electroless copper plating treatment is performed, and a seed layer 34 is formed on the surface of the solder resist layer 16 and the side surfaces of the first and second openings (16a, 16b), and on the conductor pads (14a, 14b).

Figure 3D:
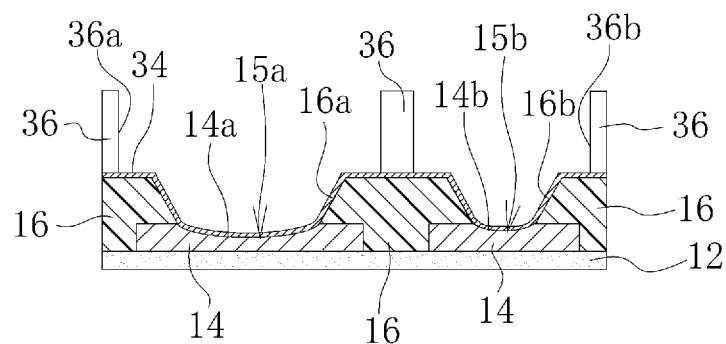
FIG. 3D is a cross-sectional view illustrating a method for manufacturing a printed wiring board according to an embodiment of the present invention.

Next, as illustrated in FIG. 3D, a plating resist 36 of a predetermined pattern having a first opening (36a) and a second opening (36b) at planed formation sites of the first and second bumps (20, 22) (FIG. 1) is formed on the seed layer 34.

Figure 3E:
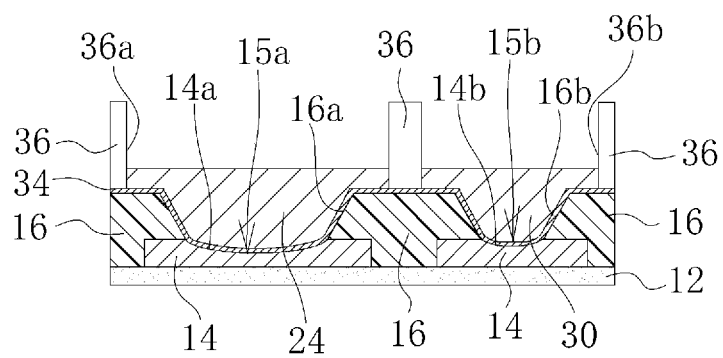
FIG. 3E is a cross-sectional view illustrating a method for manufacturing a printed wiring board according to an embodiment of the present invention.

Next, as illustrated in FIG. 3E, an electrolytic plating treatment is performed, and the first base plating layer 24 and the second base plating layer 30, which each contain, for example, copper as a main component, are formed on the seed layer 34 in the first opening (36a) and the second opening (36b) of the plating resist 36.

When the first and second base plating layers (24, 30) are formed, the plating thicknesses of the first and second base plating layers (24, 30) are preferably adjusted such that the thickness of the first base plating layer 24 and the thickness of the second base plating layer 30, measured from the surface of the solder resist layer 16, are each within a range of 3 μm-20 μm.

Figure 3F:
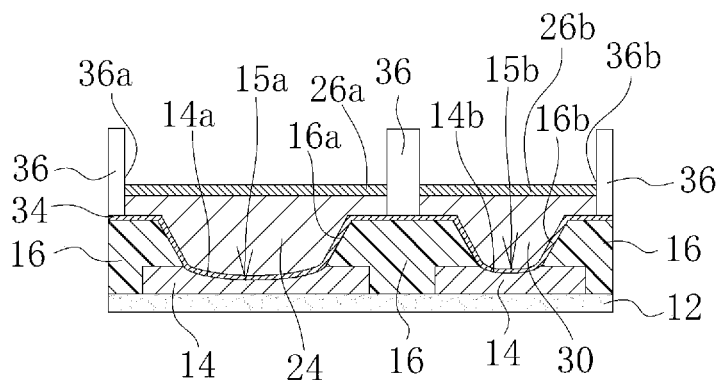
FIG. 3F is a cross-sectional view illustrating a method for manufacturing a printed wiring board according to an embodiment of the present invention.

Next, as illustrated in FIG. 3F, for example, an electrolytic plating treatment is performed, and first and second intermediate layers (26a, 26b) each containing, for example, nickel as a main component are respectively formed on the first and second base plating layers (24, 30). The first and second intermediate layers (26a, 26b) preferably each have a thickness of 7 μm or less. It is also possible that the first and second intermediate layers (26a, 26b) are not formed.

Figure 3G:
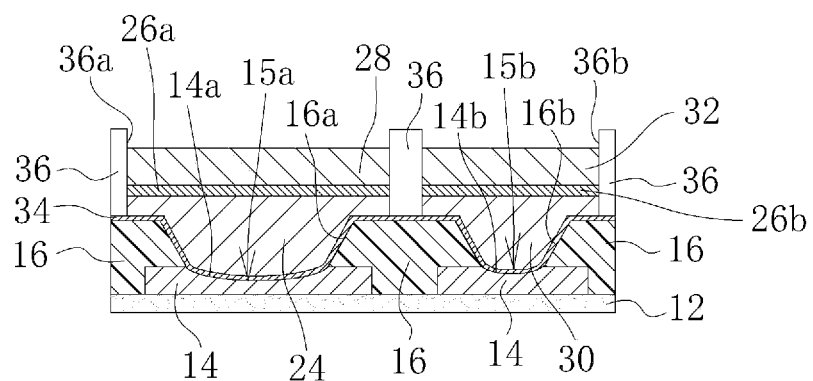
FIG. 3G is a cross-sectional view illustrating a method for manufacturing a printed wiring board according to an embodiment of the present invention.

Next, as illustrated in FIG. 3G, an electrolytic plating treatment is performed, and the first and second top plating layers (28, 32) are respectively formed on the first and second base plating layers (24, 30) via the first and second intermediate layers (26a, 26b). The first and second top plating layers (28, 32) are each formed of a metal which has a melting point lower than that of the first and second base plating layers (24, 30) and which is melted by a reflow treatment and is shaped into a substantially hemispherical shape, for example, a metal containing tin as a main component. The first and second top plating layers (28, 32) preferably each have a thickness in a range of 5 μm-45 μm.

Figure 3H:
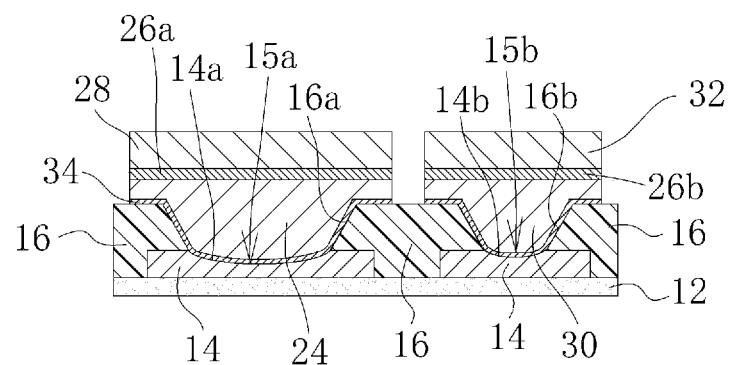
FIG. 3H is a cross-sectional view illustrating a method for manufacturing a printed wiring board according to an embodiment of the present invention.

Next, as illustrated in FIG. 3H, the plating resist 36 is peeled off. Further, a portion of the seed layer 34 exposed by the removal of the plating resist 36 is removed by etching.

Figure 3I:
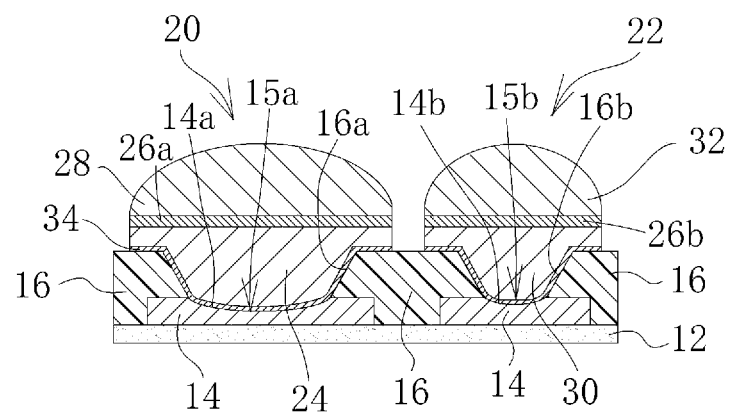
FIG. 3I is a cross-sectional view illustrating a method for manufacturing a printed wiring board according to an embodiment of the present invention.

Finally, as illustrated in FIG. 3I, a reflow treatment is performed, and the first top plating layer 28 and the second top plating layer 32 are shaped into substantially hemispherical shapes. By the reflow treatment, in the case where the first and second intermediate layers (26a, 26b) are formed, the first bump 20 and the second bump 22 each including a copper layer, a copper/nickel alloy layer, a nickel layer, a nickel/tin alloy layer and a tin layer from a side close to the first and second conductor pads (14a, 14b) are formed. In the case where the first and second intermediate layers (26a, 26b) are not formed, the first bump 20 and the second bump 22 each including a copper layer, a copper/tin alloy layer, and a tin layer from a side close to the first and second conductor pads (14a, 14b) are formed.

Figure 4:
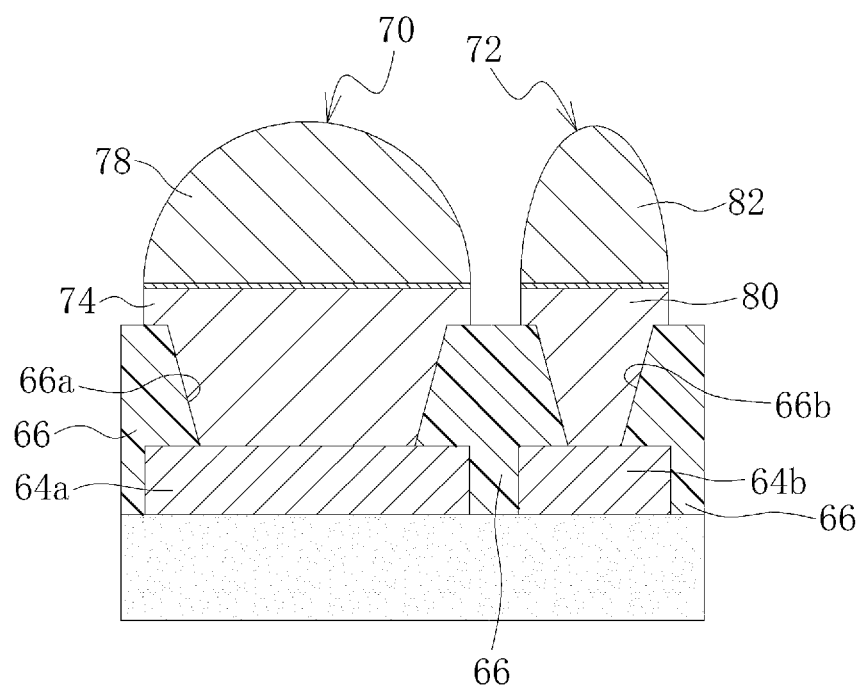
FIG. 4 is a cross-sectional view for describing how bump heights are not uniform in a printed wiring board according to a conventional technology.

In Japanese Patent Application Laid-Open Publication No. 2010-129996, as illustrated in FIG. 4, base plating layers (74, 80) are respectively formed on conductor pads (64a, 64b) in openings (66a, 66b) having different sizes formed in a solder resist layer 66, and top plating layers (78, 82) are respectively formed on the base plating layers (74, 80) to form bumps (70, 72) having different sizes.

In Japanese Patent Application Laid-Open Publication No. 2010-129996, an interface exists between the conductor pad (64a) and the base plating layer 74, and an interface exists between the conductor pad (64b) and the base plating layer 80. Therefore, when a connection area at each of these interfaces is small, connection strength between the two may become weaker, bump separation may occur, and connection reliability between conductor pads (64a, 64b) and base plating layers (74, 80) may be impaired.

A printed wiring board according to an embodiment of the present invention includes: a base insulating layer; a conductor layer that is formed on the base insulating layer; a solder resist layer that is formed on the base insulating layer and on the conductor layer, and has a first opening exposing a portion of the conductor layer as a first conductor pad and a second opening exposing another portion of the conductor layer as a second conductor pad, the second opening having a diameter smaller than that of the first opening; a first bump that is formed on the first conductor pad; and a second bump that is formed on the second conductor pad and has a smaller diameter than the first bump. The first bump has a first base plating layer formed in the first opening, and a first top plating layer formed on the first base plating layer. The second bump has a second base plating layer formed in the second opening, and a second top plating layer formed on the second base plating layer. A first recess is formed on an upper surface of the first conductor pad and a second recess is formed on an upper surface of the second conductor pad, and the first recess is larger than the second recess.

Further, a method for manufacturing a printed wiring board according to an embodiment of the present invention includes: forming a base insulating layer; forming a conductor layer on the base insulating layer; forming a solder resist layer on the base insulating layer and on the conductor layer; forming a first opening in the solder resist layer, the first opening exposing a portion of the conductor layer as a first conductor pad; forming a second opening in the solder resist layer, the second opening having a smaller diameter than the first opening and exposing another portion of the conductor layer as a second conductor pad; forming a first bump on the first conductor pad; and forming a second bump on the second conductor pad, the second bump having a diameter smaller than that of the first bump. The forming of the first bump includes: forming a first base plating layer in the first opening; forming a first top plating layer on the first base plating layer; and reflowing the first top plating layer. The forming of the second bump includes: forming a second base plating layer in the second opening; forming a second top plating layer on the second base plating layer; and reflowing the second top plating layer. After the forming of the first opening and the second opening in the solder resist layer, a first recess and a second recess are respectively formed on an upper surface of the first conductor pad and an upper surface of the second conductor pad such that the first recess is larger than the second recess.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a base insulating layer;

a conductor layer formed on the base insulating layer and including a first conductor pad and a second conductor pad;

a solder resist layer formed on the base insulating layer such that the solder resist layer is covering the conductor layer and has a first opening exposing the first conductor pad and a second opening exposing the second conductor pad; and a plurality of bumps comprising a first bump and a second bump such that the first bump is formed on the first conductor pad of the conductor layer and that the second bump is formed on the second conductor pad of the conductor layer, wherein the solder resist layer is formed such that the second opening has a diameter smaller than a diameter of the first opening, the second bump is formed such that the second bump has a diameter smaller than a diameter of the first bump, and the conductor layer is formed such that the first conductor pad has a first recess formed on a surface of the first conductor pad, that the second conductor pad has a second recess formed on a surface of the second conductor pad, and that a depth of the first recess is larger than a depth of the second recess.

2. The printed wiring board according to claim 1, wherein the first recess is 1.5 μm or larger than the second recess.

3. The printed wiring board according to claim 2, wherein the conductor layer is formed such that the first recess and the second recess are extending to portions of the conductor layer surrounding the first conductor pad and the second conductor pad and covered by the solder resist layer, respectively.

4. The printed wiring board according to claim 1, wherein the conductor layer is formed such that the first recess and the second recess are extending to portions of the conductor layer surrounding the first conductor pad and the second conductor pad and covered by the solder resist layer, respectively.

5. The printed wiring board according to claim 1, wherein the first bump includes a first base layer formed in the first opening of the solder resist layer and a first top layer formed on the first base layer such that the first top layer has a thickness in a range of 5 μm to 45 μm, and the second bump includes a second base layer formed in the second opening of the solder resist layer and a second top layer formed on the second base layer such that the second top layer has a thickness in a range of 5 μm to 45 μm.

6. The printed wiring board according to claim 1, wherein the first bump includes a first base layer formed in the first opening of the solder resist layer and a first top layer formed on the first base layer such that the first base layer includes a main component comprising copper, and the second bump includes a second base layer formed in the second opening of the solder resist layer and a second top layer formed on the second base layer such that the second base layer includes a main component comprising copper.

7. The printed wiring board according to claim 1, wherein the first bump includes a first base layer formed in the first opening of the solder resist layer and a first top layer formed on the first base layer such that the first top layer includes a main component comprising tin, and the second bump includes a second base layer formed in the second opening of the solder resist layer and a second top layer formed on the second base layer such that the second top layer includes a main component comprising tin.

8. The printed wiring board according to claim 1, wherein the first bump includes a first base layer formed in the first opening of the solder resist layer and a first top layer formed on the first base layer such that the first bump includes a first intermediate layer formed between the first base layer and the first top layer and comprising a main component comprising nickel, and the second bump includes a second base layer formed in the second opening of the solder resist layer and a second top layer formed on the second base layer such that the second bump includes a second intermediate layer formed between the second base layer and the second top layer and comprising a main component comprising nickel.

9. The printed wiring board according to claim 8, wherein the first bump is formed such that the first intermediate layer has a thickness of 7 μm or less, and the second bump is formed such that the second intermediate layer has a thickness of 7 μm or less.

10. The printed wiring board according to claim 1, wherein the solder resist layer is formed such that the first opening has an aspect ratio of 0.5 or less and that the second opening has an aspect ratio of 0.6 or more.

11. A method for manufacturing a printed wiring board, comprising:

forming, on a base insulating layer, a conductor layer including a first conductor pad and a second conductor pad;

forming a solder resist layer on the base insulating layer such that the solder resist layer covers the conductor layer;

forming a first opening in the solder resist layer such that the first opening exposes the first conductor pad of the conductor layer;

forming a second opening in the solder resist layer such that the second opening exposes the second conductor pad of the conductor layer;

forming a first recess on a surface of the first conductor pad exposed by the first opening of the solder resist layer;

forming a second recess on a surface of the second conductor pad exposed by the second opening of the solder resist layer such that a depth of the first recess is larger than a depth of the second recess;

forming a plurality of bumps comprising a first bump and a second bump such that the first bump is formed on the first conductor pad of the conductor layer and that the second bump is formed on the second conductor pad of the conductor layer, wherein the forming of the second opening includes forming the second opening in the solder resist layer such that the second opening has a diameter smaller than a diameter of the first opening, and forming the second bump on the second conductor pad such that the second bump has a diameter smaller than a diameter of the first bump.

12. The method for manufacturing a printed wiring board according to claim 11, wherein the first recess is formed such that the first recess is 1.5 μm or more larger than the second recess.

13. The method for manufacturing a printed wiring board according to claim 12, wherein the forming of the first recess includes forming the first recess such that the first recess extends to a portion of the conductor layer surrounding the first conductor pad and covered by the solder resist layer, and the forming of the second recess includes forming the second recess such that the second recess extends to a portion of the conductor layer surrounding the second conductor pad and covered by the solder resist layer.

14. The method for manufacturing a printed wiring board according to claim 11, wherein the forming of the first recess includes forming the first recess such that the first recess extends to a portion of the conductor layer surrounding the first conductor pad and covered by the solder resist layer, and the forming of the second recess includes forming the second recess such that the second recess extends to a portion of the conductor layer surrounding the second conductor pad and covered by the solder resist layer.

15. The method for manufacturing a printed wiring board according to claim 11, wherein the forming of the first bump includes forming a first base layer in the first opening of the solder resist layer and forming a first top layer on the first base layer such that the first top layer has a thickness in a range of 5 µm to 45 µm, and the forming of the second bump includes forming a second base layer in the second opening of the solder resist layer and forming a second top layer on the second base layer such that the second top layer has a thickness in a range of 5 µm to 45 µm.

16. The method for manufacturing a printed wiring board according to claim 11, wherein the forming of the first bump includes forming a first base layer in the first opening such that the first base layer includes a main component comprising copper, and the forming of the second bump includes forming a second base layer in the second opening such that the second base layer includes a main component comprising copper.

17. The method for manufacturing a printed wiring board according to claim 11, wherein the forming of the first bump includes forming a first base layer in the first opening and forming a first top layer on the first base layer such that the first top layer includes a main component comprising tin, and the forming of the second bump includes forming a second base layer in the second opening and forming a second top layer on the second base layer such that the second top layer includes a main component comprising tin.

18. The method for manufacturing a printed wiring board according to claim 11, wherein the forming of the first bump includes forming a first base layer in the first opening and forming a first top layer on the first base layer such that a first intermediate layer is formed between the first base layer and the first top layer and includes a main component comprising nickel, and the forming of the second bump includes forming a second base layer in the second opening and forming the second top layer on the second base layer such that a second intermediate layer is formed between the second base layer and the second top layer and includes a main component comprising nickel.

19. The method for manufacturing a printed wiring board according to claim 18, wherein the forming of the first bump includes forming the first intermediate layer having a thickness of 7 µm or less, and the forming of the second bump includes forming the second intermediate layer having a thickness of 7 µm or less.

20. The method for manufacturing a printed wiring board according to claim 11, wherein the forming of the first opening includes forming the first opening having an aspect ratio of 0.5 or less, and the forming of the second opening includes forming the second opening having an aspect ratio of 0.6 or more.

* * * * *